United States Patent [19]

Dobrovolny

[11] Patent Number: 5,420,646
[45] Date of Patent: May 30, 1995

[54] BANDSWITCHED TUNING SYSTEM HAVING A PLURALITY OF LOCAL OSCILLATORS FOR A DIGITAL TELEVISION RECEIVER

[75] Inventor: Pierre Dobrovolny, North Riverside, Ill.

[73] Assignee: Zenith Electronics Corp., Glenview, Ill.

[21] Appl. No.: 815,721

[22] Filed: Dec. 30, 1991

[51] Int. Cl.⁶ .................................................. H04N 5/50
[52] U.S. Cl. .................................... 348/731; 348/733; 455/165.1; 455/183.1; 455/209
[58] Field of Search ................ 358/191.1, 193.1, 195.1; 455/200.1, 183.1, 183.2, 188.1, 189.1, 199.1, 197.1, 76, 6.3, 63.1; 348/731, 733, 732

[56] References Cited

U.S. PATENT DOCUMENTS

| | | | |
|---|---|---|---|
| 2,460,900 | 2/1949 | Newbold | 455/199.1 |
| 3,909,751 | 9/1975 | Tang et al. | 333/103 |
| 4,402,089 | 5/1983 | Knight et al. | 455/186 |
| 4,551,856 | 11/1985 | Victor et al. | |
| 4,811,362 | 3/1989 | Yester, Jr. et al. | 455/343 |
| 4,922,548 | 5/1990 | Cowley | 455/183.1 |
| 4,947,456 | 8/1990 | Atkinson et al. | 455/183 |
| 4,996,597 | 2/1991 | Duffield | 358/191.1 |
| 5,148,452 | 9/1992 | Kennedy et al. | 455/260 |

FOREIGN PATENT DOCUMENTS 0408066  1/1991  European Pat. Off. ........ H04N 5/50

*Primary Examiner*—James J. Groody
*Assistant Examiner*—Glenton B. Burgess

[57] ABSTRACT

A double conversion type television tuning system for a digital television signal includes a synthesizer for developing a tuning voltage for the upconverter. The synthesizer provides bandswitching for dividing the tuning range into four portions and includes a separate local oscillator for each portion. Each local oscillator is enabled by a transistor that is switched by a bandswitch voltage. The output of each oscillator is applied through respective bandswitched buffer amplifiers to an arrangement of three 3 dB hybrid couplers to convey the appropriate local oscillator signal to the upconverter mixer. The system minimizes phase noise and jitter which is essential when operating with digital signals.

8 Claims, 3 Drawing Sheets

BANDSWITCHED TUNING SYSTEM HAVING A PLURALITY OF LOCAL OSCILLATORS FOR A DIGITAL TELEVISION RECEIVER

CROSS REFERENCE TO RELATED APPLICATIONS

This application is related to, but not dependent upon, application (D6522) Ser. No. 815,711, filed Dec. 30, 1991, entitled AGC CIRCUIT FOR DOUBLE CONVERSION DIGITAL TELEVISION TUNER in the name of the inventor and assigned to Zenith Electronics Corporation.

BACKGROUND OF THE INVENTION

This invention relates generally to television signal systems and particularly to television signal systems which utilize digital transmission techniques.

The recent efforts to develop a high definition television system for the United States has created a strong desire to transmit television signals in digital form. A major disadvantage of the digital data format, however, is the lack of redundancy in the data. For example, with conventional analog television signals, a wide variety of noise conditions that may signal dropouts and other transmission problems, can be tolerated. This is because the data or information in the signal is redundant that is, it is repeated often which, to a large extent, permits errors to be integrated out. On the contrary, digital data has no redundancy and the failure to properly detect and decode any portion of the digital data results in that portion of the data being lost. Accordingly, it is very important that low noise components and signals be used in digital signal processing, at least prior to detection of the data, to assure that the true signal level of the digital data (and not noise) is recovered.

In local oscillators in particular, it is imperative that high Q tuned circuits be used. In heterodyning oscillators, mixers and the like, it is essential to avoid phase noise and jitter which give rise to noise in the digital environment and make detection of the correct digital data level very difficult.

The television frequency band in the United States extends from 50 MHz to approximately 800 MHz. In conventional analog tuning systems, a tunable local oscillator produces signals that are mixed with the incoming radio frequency (RF) signals to produce a fixed frequency output signal, e.g. a so-called intermediate frequency (IF), for every channel. In some cable systems, the tuning process uses double conversion in which the RF input signal is initially upconverted to a higher fixed first IF frequency, subjected to appropriate filtering, and subsequently downconverted to the conventional television IF frequency, referred to as a second IF in a double conversion system. A first local oscillator is used for upconversion and a second local oscillator is used for downconversion. The double conversion process, with its main selectivity involving fixed tuning, has the advantage of small channel-to-channel performance variations.

The present invention is directed to a high Q tuning system for a digital television signal. In particular, it is implemented in a double conversion system that includes a synthesizer for producing a tuning signal, in response to a channel input signal, for upconverting the RF signal. The synthesizer includes a plurality of local oscillators that are bandswitched to increase the Q of the tank circuits and thereby improve the noise performance of the system over the television signal tuning range.

OBJECTS OF THE INVENTION

A principal object of the invention is to provide an improved digital television signal tuning system.

Another object of the invention is to provide a digital television tuning system having excellent phase noise performance characteristics.

A further object of the invention is to provide a novel bandswitched upconversion tuning system for a digital television signal.

BRIEF DESCRIPTION OF THE DRAWINGS

These and other objects and advantages of the invention will be apparent upon reading the following description in conjunction with the drawings in which.

DESCRIPTION OF THE PREFERRED EMBODIMENT

Figure 1:
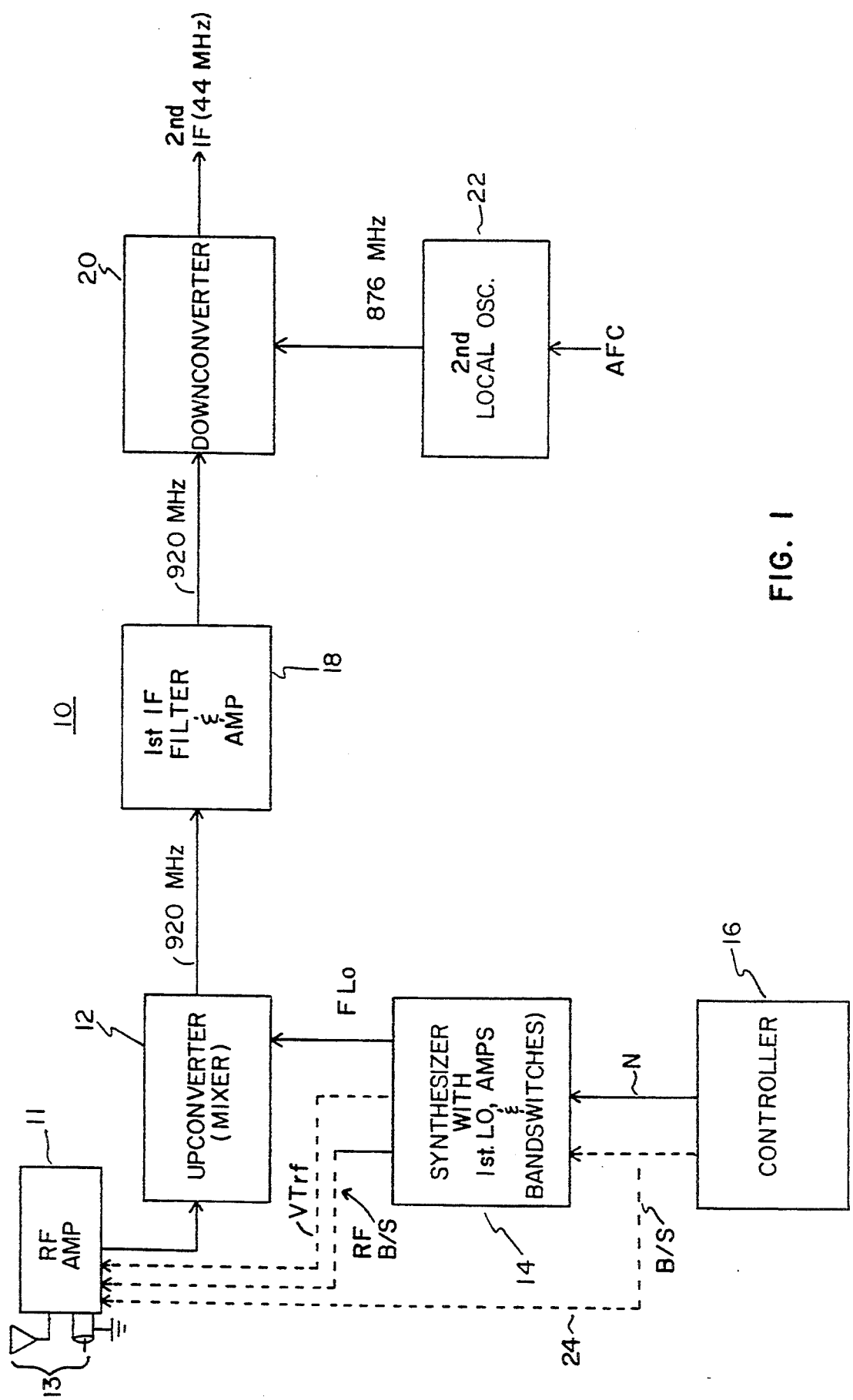
FIG. 1 is a simplified block diagram of a digital television tuning system constructed in accordance with the invention.

In FIG. 1, a double conversion tuning system 10 includes an RF amplifier 11 having a cable/antenna input 13, that is coupled to an upconverter (mixer) 12 that provides a 920 MHz output signal, which is supplied to a first IF filter and amplifier 18. The filtered and amplified 920 MHz signal is supplied to a downconverter 20 that is also supplied with an 876 MHz signal from a second local oscillator 22 to produce a 44 MHz second IF output signal. A synthesizer 14, which includes a bandswitching means, digital-to-analog converters and means for generating a first local oscillator tuning voltage, supplies a local oscillator signal FLo to upconverter 12. It is contemplated that synthesizer 14 may also be used to supply tuning and bandswitching voltages for tuning of the RF amplifier 11, the connections therefor being shown by dashed lines. Synthesizer 14 is supplied with a channel signal N from controller 16, which signal N may be a suitable identifying code carried on a serial or parallel bus. A bandswitch signal B/S is also indicated as being supplied from controller 16, although the final bandswitching voltages or currents may be developed in the synthesizer. An alternate dashed line bus 24 coupling B/S signals from controller 16 to RF amplifier 11 is also illustrated. The bandswitch signal in this instance may be supplied directly to RF amplifier 11 for switching circuits that provide RF selectivity (not shown). The circuit of FIG. 1 operates as a conventional double conversion tuning arrangement with the exception that synthesizer 14 includes separate, bandswitched local oscillators to provide enhanced phase noise performance for upconverting the received digital television signals.

Figure 2:
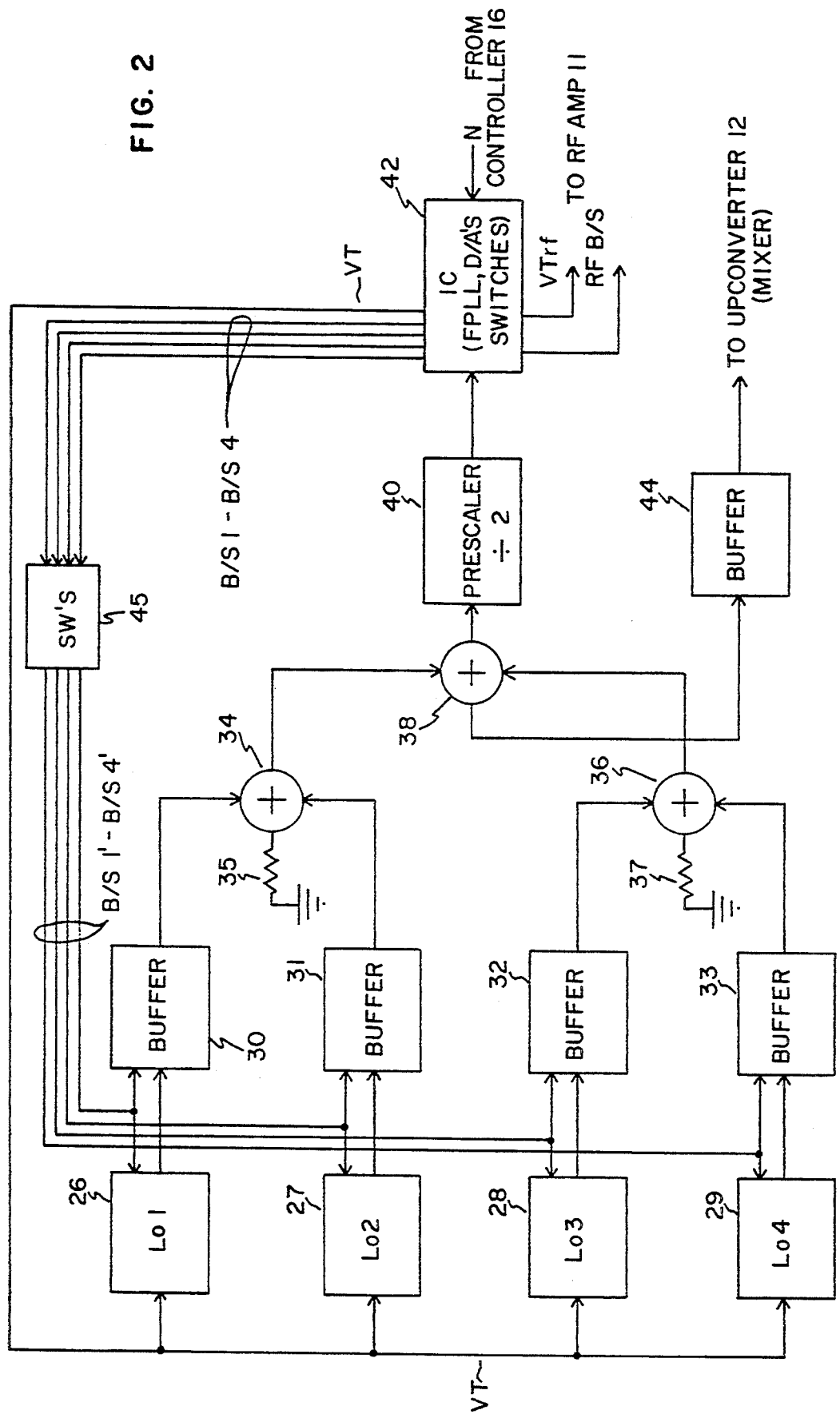
FIG. 2 is a block diagram of the synthesizer of FIG. 1.

FIG. 2 shows the synthesizer 14, which includes four local oscillators 26, 27, 28 and 29, each AC coupled to a corresponding one of four buffer amplifiers 30, 31, 32 and 33. The buffer amplifiers 30-33 and the local oscillators 26-29 are respectively controlled by four bandswitch signals. Bandswitch signals B/S1-B/S4 are applied to a switching circuit 45 which develops the actual bandwidth voltages B/S1'-B/S4'. A tuning voltage VT from a frequency and phase locked loop (FPLL) 42 is coupled to each of the local oscillators 26–29. IC 42 is part of the synthesizer 14 and includes an FPLL, D/A converters and appropriate switches for developing the analog VTrf signal and the digital B/S signals. IC chip 42 is available from Motorola as part No. MC44810. The input to IC 42 is the signal N from controller 16 and which is related to the channel number of the television signal being tuned. The outputs of buffer amplifiers 30 and 31 are supplied to a 3 dB hybrid coupler 34 and the outputs of buffer amplifiers 32 and 33 are supplied to a 3 dB hybrid coupler 36. One output of each of hybrid couplers 34 and 36 is coupled to another 3 dB hybrid coupler 38 and their other outputs are terminated to ground through impedance matched terminating resistors 35 and 37. One output of 3 dB hybrid coupler 38 is coupled to a prescaler 40 and the other output is coupled to a buffer amplifier 44. The output of prescaler 40 is coupled to IC 42 and the output of buffer amplifier 44 is coupled to the upconverter (mixer) 12 in FIG. 1.

The operation of the synthesizer 14 of FIG. 2 is straightforward. In response to the channel input signal N, IC 42 develops a tuning voltage VT which is applied to the four local oscillators 26–29. IC 42 also develops one of the bandswitch signals (B/S1–B/S4), which is applied to switching circuit 45. A corresponding bandswitch voltage B/S1'–B/S4' is developed and applied to the corresponding one of the local oscillators (and its associated buffer) depending upon the television channel to be tuned, e.g. determined by input signal N. VTrf and RF B/S signals may also be developed depending upon the circuit environment, as discussed above. The enabled one of the four local oscillators (and buffers) produces a first Lo signal that propagates through its associated buffer amplifier and the appropriate combination of 3 dB hybrid couplers to prescaler 40 and to buffer amplifier 44. The Lo signal supplied to the prescaler 40 is then used to lock the FPLL in IC 42 whereas the Lo signal from the output of buffer 44 is supplied to the mixer circuit in the upconverter 12.

Figure 3:
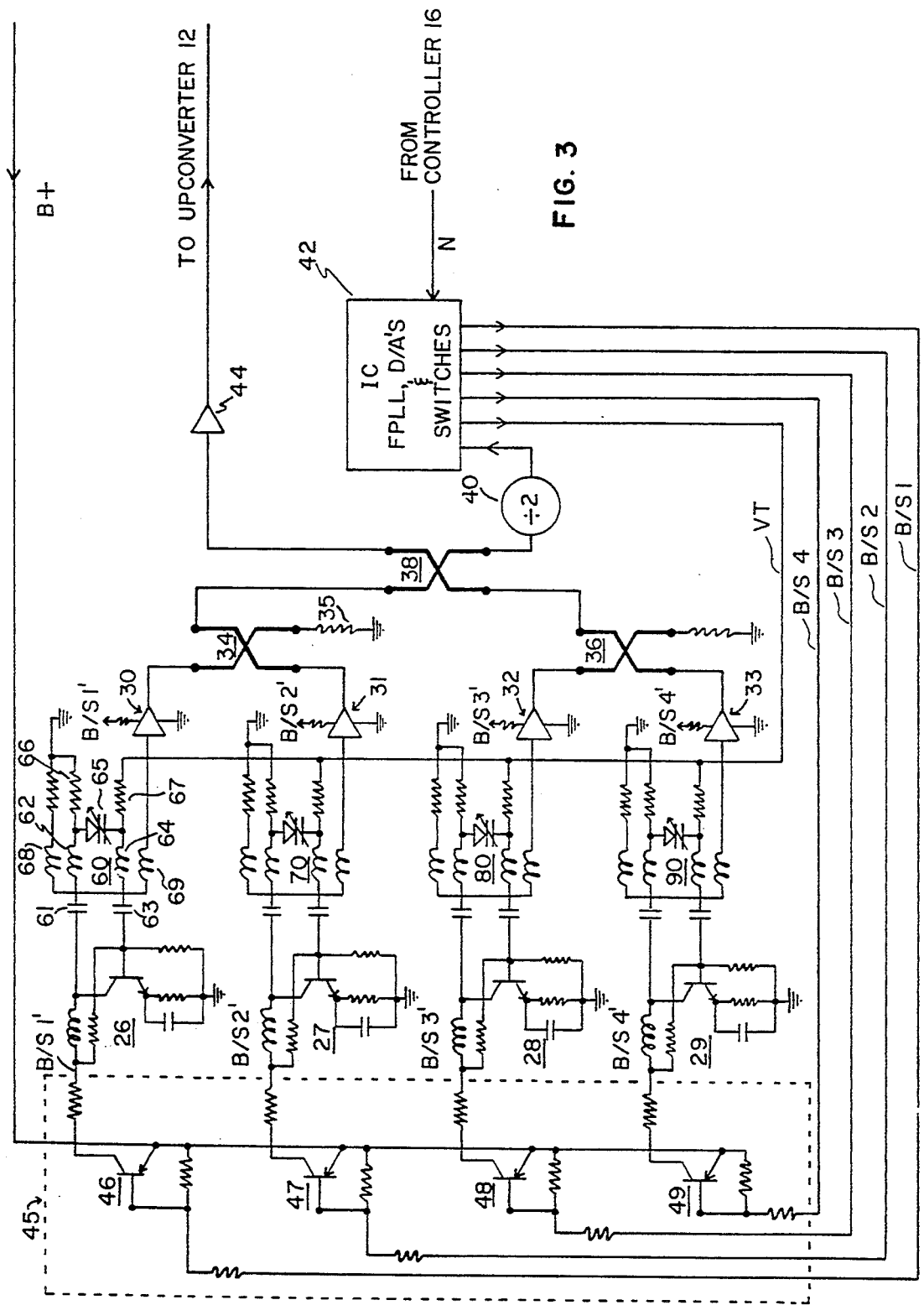
FIG. 3 is a partial schematic diagram of the synthesizer of FIG. 1.

In the more detailed circuit of FIG. 3, switching circuit 45 includes four switching transistors 46, 47, 48 and 49 which are coupled to the local oscillators 26, 27, 28 and 29, respectively, and develop the bandswitch voltages B/S1'–B/S4'. While the switching transistors and their associated elements are shown in schematic form, they will not be discussed in detail since their operation is conventional and well known in the art. The tuned circuits 60, 70, 80 and 90 for each of the local oscillators 26–29 are essentially the same. Only tuned circuit 60 will be described, it being understood that tuned circuits 70, 80 and 90 are similar except for component values, since the tuned frequencies of the local oscillators are different. The collector of the transistor in local oscillator 26 is connected to the upper side of a tank circuit comprising capacitors 61 and 63, coils 62 and 64 and varactor diode 65 whereas its base is connected to the lower side of the tank circuit. The tuning varactor diode 65 which is coupled between the junctions of coil 62 and coil 64 is biased through resistors 66 and 67 with the tuning voltage VT. A pair of coupling coils 68 and 69 are connected between ground and the input of buffer amplifier 30. The output of buffer amplifier 30 is connected to the first port of 3 dB hybrid coupler 34. Buffer amplifier 30 is controlled by bandswitch voltage B/S1'. Tuned circuit 70 of local oscillator 27 has its output coupled to buffer amplifier 31 which in turn is connected to the second port of 3 dB hybrid coupler 34. The third port of coupler 34 is terminated with a resistor 35 and the fourth port of coupler 34 provides an Lo signal to the first port of 3 dB hybrid coupler 38.

It will be appreciated that because of the very high frequencies involved in the circuit that the various circuit components, such as capacitors 61 and 63, coils 62, 64, 68 and 69 and resistors 66 and 67 are fabricated in matched pairs on suitable printed circuit boards. As is well known, at these high frequencies the elements may simply comprise areas and strips of properly positioned foil on a low loss (i.e. Teflon) PC board. The PC board, coils, capacitors and resistors are appropriately arranged to produce balanced circuits for minimizing mutual coupling between the separate local oscillator circuits. The various stray capacitances are of course included in the overall tuning capacitances of the circuit. The 3 dB hybrid couplers preferably comprise small copper tubes with a pair of insulated wires threaded therethrough, but may also be fabricated in printed form.

Prescaler 40 is for the purpose of reducing the signal frequencies that must be processed by the integrated circuit synthesizer chip. As mentioned, the channel select input is a signal N which is based upon the desired television channel and the tuning voltage and bandswitch signals may be conveniently derived from a ROM (not shown) within the controller 16.

With the invention, a low noise varactor diode tuning arrangement is provided for tuning digital television signals by dividing the television band into four portions, each of which is covered by a different local oscillator. In this manner, the Q of the tuned circuits is raised sufficiently to minimize oscillator phase noise and thereby enhance processing of the digital data.

It is recognized that numerous changes in the described embodiment of the invention will be apparent to those skilled in the art without departing from its true spirit and scope. The invention is to be limited only as defined in the claims.

What is claimed is:

1. A digital television signal tuning system comprising:

means for receiving a digital television signal in a given tuning range;

synthesizer means developing a tuning voltage and including a plurality of variable frequency local oscillators for developing a tuning signal responsive to said tuning voltage;

bandswitch means in said synthesizer means for subdividing said given tuning range into a plurality of portions corresponding to said plurality of variable frequency local oscillators for improving the noise performance of said synthesizer means; and means for supplying a signal, indicative of said digital television signal, to said synthesizer means for controlling said bandswitch means and the operation of said plurality of variable frequency local oscillators for determining said tuning signal, said synthesizer means further including a plurality of buffer amplifiers coupled to said plurality of variable frequency local oscillators, and coupling means connected to the outputs of said buffer amplifiers for supplying said tuning signal.

2. The tuning system of claim 1 wherein said bandswitch means further includes a plurality of switching transistors for enabling respective ones of said plurality of variable frequency local oscillators.

3. The tuning system of claim 2 wherein said coupling means includes a plurality of 3 dB hybrid couplers connected to said buffer amplifiers and supplying said tuning signal.

4. A digital television signal tuning system comprising:
- means for receiving a digital television signal in a given tuning range;
- synthesizer means for generating a tuning voltage and developing a first tuning signal;
- upconverter means for developing a first fixed frequency signal from said digital television signal and said first tuning signal;
- means developing a second tuning signal for downconverting said first fixed frequency signal to a second fixed frequency signal;
- bandswitch means in said synthesizer means for subdividing said given tuning range into a plurality of portions for improving the noise performance of said synthesizer means; and
- means for supplying a signal, indicative of said digital television signal, to said synthesizer means for controlling said bandswitch means generating said tuning voltage and for determining said first tuning signal, said synthesizer means including a plurality of varactor diode tuned variable frequency local oscillators, said bandswitch means selectively operating said variable frequency local oscillators in respective ones of said plurality of said portions of said given tuning range.

5. The tuning system of claim 4 wherein said synthesizer means further includes:
- a plurality of buffer amplifiers coupled to said plurality of variable frequency local oscillators; and
- coupling means for supplying the outputs of said buffer amplifiers to said upconverter means.

6. The tuning system of claim 5 wherein said bandswitch means includes a plurality of switching transistors for enabling respective ones of said plurality of variable frequency local oscillators.

7. The tuning system of claim 6 wherein said coupling means includes a plurality of 3 dB hybrid couplers connected between said buffer amplifiers and said upconverter means.

8. A system for tuning a digital television signal received over a television channel within a given tuning range, comprising:
- synthesizer means including a plurality of varactor diode controlled variable frequency local oscillators, each operable in response to a tuning voltage, for generating a tuning signal for tuning television channels within a respective portion of said given tuning range;
- a plurality of buffer amplifiers coupled to said plurality of variable frequency local oscillators;
- bandswitch means, in said synthesizer means, responsive to a channel signal representing said television channel for generating a plurality of bandswitch signals for selectively enabling one of said plurality of variable frequency local oscillators and a corresponding one of said buffer amplifiers for generating said tuning signal; and
- means responsive to said channel signal and to the tuning signal for generating said tuning voltage.

* * * * *